United States Patent
Prinz et al.

(10) Patent No.: US 11,453,559 B2
(45) Date of Patent: Sep. 27, 2022

(54) SENSOR DEVICE FOR RECOGNIZING CONSECUTIVE OBJECTS

(71) Applicants: SICK AG, Waldkirch (DE); Deutsche Post AG, Bonn (DE)

(72) Inventors: Oliver Prinz, Waldkirch (DE); Rainer Imm, Waldkirch (DE); Bernd Hartmann, Grafschaft-Leimersdorf (DE)

(73) Assignees: SICK AG, Waldkirch/Breisgau (DE); DEUTSCHE POST AG, Bonn (DE)

( * ) Notice: Subject to any disclaimer, the term of this patent is extended or adjusted under 35 U.S.C. 154(b) by 368 days.

(21) Appl. No.: 16/877,751

(22) Filed: May 19, 2020

(65) Prior Publication Data
US 2020/0369476 A1 Nov. 26, 2020

(30) Foreign Application Priority Data
May 20, 2019 (DE) .......................... 102019113219.3

(51) Int. Cl.
*B65G 43/08* (2006.01)
*B65G 39/10* (2006.01)
(Continued)

(52) U.S. Cl.
CPC ........... *B65G 43/08* (2013.01); *B65G 13/075* (2013.01); *B65G 39/10* (2013.01); *G01B 7/023* (2013.01);
(Continued)

(58) Field of Classification Search
CPC .... G01B 7/023; G01B 7/107; G01R 31/1263; B65G 43/08; B65G 39/10; B65G 2203/043; B65G 47/54; B65G 13/075
(Continued)

(56) References Cited

U.S. PATENT DOCUMENTS 4,654,010 A * 3/1987 Havriluk ................ A63B 24/00
455/100
5,373,235 A * 12/1994 Clark, Jr. ................ G01B 7/14
324/67
(Continued)

FOREIGN PATENT DOCUMENTS

CN       103269969 A    8/2013
DE        3725077 A1   12/1987
(Continued)

OTHER PUBLICATIONS

European Search Report dated Oct. 7, 2020 corresponding to application No. 20169959.2-1017.
(Continued)

*Primary Examiner* — James R Bidwell
(74) *Attorney, Agent, or Firm* — Nath, Goldberg & Meyer; Jerald L. Meyer (57) ABSTRACT

A method of recognizing consecutive objects on a conveying path in a detection zone arranged on the conveying path comprises the following steps:
  generating an electromagnetic radio frequency field radiating into the detection zone by way of a radio frequency sensor;
  measuring a time curve of a dielectric conductivity in the detection zone by using of the radio frequency field of the radio frequency sensor; and
  determining contour information of the consecutive objects from the time curve of the dielectric conductivity.

20 Claims, 7 Drawing Sheets

(51) Int. Cl.
*G01B 7/02* (2006.01)
*G01B 7/06* (2006.01)
*G01R 31/12* (2020.01)
*B65G 13/075* (2006.01)

(52) U.S. Cl.
CPC ......... *G01B 7/107* (2013.01); *G01R 31/1263* (2013.01); *B65G 2203/043* (2013.01)

(58) Field of Classification Search
USPC .................................... 324/663; 198/370.01
See application file for complete search history.

(56) References Cited

U.S. PATENT DOCUMENTS

| | | | |
|---|---|---|---|
| 6,278,270 | B1 | 8/2001 | Robles-Flores et al. |
| 6,398,734 | B1* | 6/2002 | Cimochowski ...... A61B 5/6884 600/459 |
| 9,399,557 | B1* | 7/2016 | Mishra ................... B65G 43/08 |
| 10,625,952 | B1* | 4/2020 | Luthra ...................... B07C 5/36 |
| 2013/0144554 | A1 | 6/2013 | Walton et al. |
| 2016/0047757 | A1 | 2/2016 | Kuznetsov et al. |
| 2018/0372949 | A1* | 12/2018 | Abramov ................. B64G 1/66 |
| 2019/0041236 | A1* | 2/2019 | Nikic ................... G01R 33/077 |
| 2019/0145923 | A1* | 5/2019 | Mamigonians ...... G01N 27/041 324/663 |
| 2020/0087077 | A1 | 3/2020 | Hartmann et al. |

FOREIGN PATENT DOCUMENTS

| | | |
|---|---|---|
| DE | 10131019 A1 | 12/2002 |
| DE | 102010055552 A1 | 6/2012 |
| DE | 102014109399 A1 | 1/2016 |
| DE | 102014109402 A1 | 1/2016 |
| DE | 102015110491 B3 | 8/2016 |
| DE | 102018215773 A1 | 3/2020 |
| EP | 3435115 A1 | 1/2019 |
| JP | 1029717 A | 2/1998 |
| WO | 2007098935 A2 | 9/2007 |
| WO | 2016000685 A1 | 1/2016 |

OTHER PUBLICATIONS

German Search Report dated Jan. 14, 2020 corresponding to application No. 10 2019113219.3.
The First Office Action dated Sep. 14, 2021 corresponding to Chinese application No. 202010429294.5.
Yilin Du: "The New Development and Application of Intelligent Security", 2018, ISBN 978-7-5680-3941-3. This document discloses in Chapter I the technology about coding recognition.
D.H.Pamlay: "Radio Technology", 1950, discloses in Chapter 13 the basic principle of Radar.

* cited by examiner

SENSOR DEVICE FOR RECOGNIZING CONSECUTIVE OBJECTS

The present invention relates to a method of recognizing consecutive objects on a conveying path, to a sensor device for recognizing consecutive objects on a conveying path, and to a conveying device having a sensor device for recognizing consecutive objects on a conveying path.

Conveying devices are inter alia used in warehouses or sorting centers for the transport of the most varied objects, for example, of individual packages, bulk cargo containers or the like and can be configured as roller conveyors or belt conveyors. An uncontrolled flow of objects, in which individual objects are disposed next to or on one another, frequently occurs on the conveying path of such conveying devices. This can, for example, be due to the fact that the conveyed objects move onto the conveying path at different points and in an uncontrolled manner, for instance, in that they are thrown or tilted. In addition, unwanted recesses or accumulations can arise during the course of the conveying, for instance, when individual objects wedge at constrictions.

For a correct and non-destructive further handling of the conveyed objects, for example for a correct sorting of the objects, it is, however, frequently necessary that the packages are conveyed individually and spaced apart from one another. The separation of objects disposed next to or above one another typically takes place by so-called singulators that are arranged in the conveying path. To control the singulators and to monitor the separation performed by the singulators, sensors are used that recognize whether there are sufficient distances between the objects or whether two objects incorrectly lie next to or above one another.

Sensors by means of which an insufficient separation or a separation of consecutive objects on a conveying path can be detected are usually configured as optical sensors, for instance, as laser scanners or light barriers or as ultrasound sensors. The sensors are in this respect typically arranged above the conveying path and directed from above onto the conveying path, which entails a comparatively high installation effort. In addition, the conveyed objects can abut the installation frames, which are used for installation and which surround the conveying path, and can be damaged in so doing. Apart from the installation effort, optical sensors additionally have the disadvantage that they are sensitive with respect to the influence of external light, to contamination, to dust or the like.

It is the object of the invention to provide a method of recognizing consecutive objects on a conveying path; a sensor device; and a conveying device such that the consecutive objects can be detected reliably and without a great installation effort.

This object is satisfied by a method, a sensor device, and a conveying device in accordance with the independent claims. Further developments are respectively set forth in the dependent claims.

A method of recognizing consecutive objects on a conveying path in a detection zone arranged on the conveying path is provided, wherein the method comprises the following steps:
  generating an electromagnetic radio frequency field radiating into the detection zone by means of a radio frequency sensor;
  measuring a time curve of a dielectric conductivity in the detection zone by means of the radio frequency field of the radio frequency sensor; and
  determining contour information of the consecutive objects from the time curve of the dielectric conductivity.

It has been recognized within the framework of the invention that consecutive objects on the conveying path can be particularly reliably and easily recognized and distinguished from one another in that the time curve of the dielectric conductivity is measured and contour information of the consecutive objects is determined from the curve measured. The variation in time of the dielectric conductivity in the detection zone in particular depends on the material of the objects passing through the detection zone so that the objects can also be distinguished from one another based on their materials by means of the measurement of the dielectric conductivity.

The radio frequency sensor can in particular be arranged below the conveying path, i.e. at a side of the conveying path (e.g. of a transport belt) disposed opposite the objects conveyed and the radio frequency field can be radiated into the detection zone from the lower side of the conveying path. A sensor device comprising the radio frequency sensor can thereby be designed in a particularly space-saving manner without requiring components arranged next to or above the conveying path.

A conveying device that moves the objects along the conveying path can, for example, be configured as a roller conveyor, for instance as a roller track, or as a belt conveyor, for example as a planar conveyor belt. The conveying device can in particular comprise transport rollers, wherein the objects can either lie directly on the transport rollers, for instance in the case of a roller conveyor, or on a conveying element running over the transport rollers, for instance on a conveyor belt in the case of a belt conveyor.

The radio frequency sensor can be arranged below or between the transport rollers of the conveying device. It is particularly advantageous, as it is space-saving, if the radio frequency sensor is arranged in a transport roller. A dielectric layer, for example a part of a transport roller produced from a dielectric material or a part of a dielectric conveyor belt, can in particular be located between the radio frequency sensor and the detection zone. A thickness of the dielectric layer can amount to less than one wavelength, in particular to less than one tenth of the wavelength, in particular to less than one hundredth of the wavelength of the electromagnetic radio frequency field radiated by the radio frequency sensor.

The radio frequency sensor generating the electromagnetic radio frequency field radiating into the detection zone can, for example, be configured as a radio frequency resonator, a radio frequency antenna, or a radio frequency line. The radio frequency sensor can in this respect be configured as a waveguide structure or a planar conductor structure. The waveguide structure can in particular be configured as a hollow space resonator, as a horn antenna, or as a waveguide. The planar conductor structure can, for instance, be configured as a microstrip conductor structure or a coplanar waveguide conductor structure (CPW conductor structure), for instance, as a microstrip resonator or a CPW resonator, as a patch antenna, or as a microstrip line or a CPW line.

A change in the dielectric conductivity in the detection zone can, for example, be measured in that a resonant frequency of the radio frequency sensor and/or an impedance of the radio frequency sensor changes in dependence on the material of the objects entering the detection zone.

A decoupling signal can be used as a sensor signal of the radio frequency sensor from which the time curve of the dielectric conductivity is determined, said decoupling signal being decoupled from the conductor structure of the radio frequency sensor during or after the feeding in of a feed signal. The decoupling signal can, for example, be a reflection signal reflected by the conductor structure of the radio frequency sensor, for instance in the case of a radio frequency sensor configured as a radio frequency resonator or as a radio frequency antenna, or it can be a transmission signal transmitted by the conductor structure of the radio frequency sensor, for instance in the case of a radio frequency sensor configured as a radio frequency line. The time curve of the dielectric conductivity can, for example, be determined from amplitude information and/or phase information and/or frequency information of the decoupling signal.

To measure the time curve of the dielectric conductivity, the method can comprise a detection of the sensor signal of the radio frequency sensor and a determination of a measurement variable from the sensor signal that represents the dielectric conductivity. The measurement variable can be the dielectric conductivity itself or a derived measurement variable depending on the dielectric conductivity. Such a derived measurement variable can, for example, be an attenuation, in particular a frequency-dependent attenuation, and/or a phase shift, in particular a frequency-dependent phase shift, of the decoupling signal in relation to the feed signal.

The measurement variable can be calculated, for example analytically or numerically, from the sensor signal of the radio frequency sensor within the framework of a data preprocessing. The contour information can subsequently be determined from the measurement variable by means of an object recognition method, for example, in that the time curve of the measurement variable is compared with previously taught reference variables. The object recognition method can, for example, be implemented as a neural network. In the object recognition method, the time curve of the measurement variable or the time curve of the dielectric conductivity can, for example, be used as an input variable and the contour information can be provided as an output variable.

When determining the contour information, additional measurement signals can be taken into account in addition to the dielectric conductivity. Such an additional measurement signal can in particular comprise an object profile of the consecutive objects measured in parallel with the conveying path. The object profile can, for example, be measured by means of a camera, a laser scanner, or a distance sensor. However, an acceleration signal of an acceleration sensor arranged below the conveying path in addition to the radio frequency sensor can also be taken into account as an additional measurement signal. An object falling onto the conveying path can, for example, be recognized by means of the acceleration sensor.

A consideration of additional measurement signals makes it possible to determine particularly precise contour information of the objects following one another on the conveying path and to thereby improve an object recognition based on the contour information. Additional information obtained from the additional measurement signals can, for example, be complementary to the information obtained from the measurement of the dielectric conductivity, wherein the complementary additional information includes information that is not directly included in the information obtained from the dielectric conductivity.

The contour information determined from the time curve of the dielectric conductivity can, for example, comprise a length, a width, or a support surface of the objects. The contour information can furthermore comprise a position of the objects in a transverse direction oriented perpendicular to the conveying direction of the conveying path.

Based on the contour information, the objects following one another on the conveying path can in particular be distinguished from one another and it can be recognized whether the objects are respectively separated or not. If two objects are conveyed without a distance, in particular in an overlapping manner, the method can thus further comprise a generation of a warning signal. It can inter alia be determined by means of the warning signal whether a preceding separation was successful and objects that are not separated can be expelled from the conveying path for a subsequent separation on the basis of the warning signal. If the method is carried out by a sensor device arranged upstream of a singulator, the contour information can thus be used to control conveying devices of the singulator based on the measured contour information of the objects, in particular based on the measured positions of the objects on the conveying path, such that a separation is achieved.

A further development of the method comprises a determination of an object distance of two consecutive objects as contour information determined from the time curve of the dielectric conductivity. The object distance of consecutive objects can be in particular be determined from the time interval between a change in the dielectric conductivity, which is caused by the exit of a preceding object from the detection zone, and a change in the dielectric conductivity which is caused by the entry of a following object into the detection zone.

A further development of the method comprises a determination of an overlap of a plurality of consecutive objects as contour information determined from the time curve of the dielectric conductivity.

A further development of the method comprises a determination of support angles of the objects passing through the detection zone as contour information determined from the time curve of the dielectric conductivity.

An overlap of consecutive objects or a support angle of the objects passing through the detection zone can be in particular be recognized by means of a continuously increasing dielectric conductivity or a continuously decreasing dielectric conductivity in the detection zone, with the decrease or the increase in the dielectric conductivity being caused by a decrease or an increase of that part zone of the detection zone which is taken up by an object disposed obliquely on the conveying path. Due to a decrease or an increase of the dielectric conductivity, an object that is not areally disposed on the conveying path or an object that is only disposed on the conveying path with an edge or a corner can in particular be recognized.

The detection zone can be located within the near field or the evanescent field of the conductor structure of the radio frequency sensor; the detection zone can in particular be arranged completely within the near field or the evanescent field of the conductor structure of the radio frequency sensor. If the detection zone is completely arranged in a near field zone of the radio frequency field of the radio frequency sensor, a distance of the detection zone from the radio frequency sensor can, for example, preferably amount to less than one wavelength of the radio frequency field, approximately to less than one third of the wavelength of the radio frequency field. If the detection zone is arranged in the near field zone of the radio frequency field, the objects located in the detection zone are detected by means of the evanescent field of the radio frequency sensor. This enables a particularly accurate and reliable measurement of the dielectric conductivity, in particular in comparison with a detection in the far field of the radio frequency sensor.

Alternatively, the detection zone can also be arranged in the far field of the radio frequency sensor and the dielectric conductivity can be determined via a portion of the radio frequency signal radiated by the radio frequency sensor and reflected by the objects. An arrangement of the detection zone in the far field of the radio frequency sensor allows the radio frequency sensor to be arranged at a greater distance from the conveying path than in the case of an arrangement of the detection zone in the near field. The radio frequency sensor can thereby be positioned in a particularly flexible manner.

In a further development of the method, the radio frequency sensor is configured as a radio frequency resonator and the time curve of the dielectric conductivity is determined from a time change of a resonant frequency of the radio frequency resonator. The resonant frequency can, for example, be determined from amplitude information and/or phase information of the decoupling signal decoupled from the radio frequency resonator. The decoupling signal can in particular be the reflection signal reflected by the radio frequency resonator.

In a further development of the method, the radio frequency sensor is configured as an antenna radiating into the detection zone and the time curve of the dielectric conductivity is determined from a time change of an electrical reflection signal reflected by the antenna. As in the radio frequency resonator, the reflection signal reflected by the antenna can in particular be determined from amplitude information and/or phase information of a decoupling signal decoupled from the radio frequency antenna.

In a further development of the method, the dielectric conductivity is determined from a reflected portion of a radio frequency signal fed into the radio frequency sensor. The reflected portion can, for example, be measured as the decoupling signal and the dielectric conductivity can, for example, be obtained from amplitude information and/or phase information of the decoupling signal.

In a further development of the method, the radio frequency sensor is a microwave sensor and the radio frequency field is a microwave field. The radio frequency field can in particular have a frequency in the range of 500 MHz to 50 GHz, in particular of 700 MHz to 10 GHz, approximately of 1 GHz to 6 GHz.

In a further development of the method, the radio frequency sensor is arranged in a transport roller arranged at the conveying path. The radio frequency sensor can be arranged in the transport roller in a particularly space-saving manner below the conveying path. In addition, the radio frequency sensor is protected against mechanical influences in the transport roller.

The transport roller can in particular be made from a dielectric material and as a hollow cylinder. A radial thickness of the transport roller can amount to less than 10 mm, in particular to less than 5 mm, in particular to less than 3 mm. The transport roller can, for example, have a diameter of between 20 mm and 80 mm, in particular of 50 mm, for example.

In a further development of the method, the radio frequency sensor is formed on a support plate which is arranged on a rotary axle of the transport roller. The support plate can in particular be configured as a circuit board and the radio frequency sensor can be configured as a planar conductor structure. The radio frequency sensor can thereby be manufactured particularly easily and cost-effectively.

In a further development of the method, the radio frequency sensor comprises a plurality of individual sensors, wherein the individual sensors are arranged next to one another along a transverse direction of the conveying path that is oriented perpendicular to a conveying direction of the conveying path. The detection zone then comprises a plurality of individual detection zones that are arranged next to one another in the transverse direction and that are each associated with one of the individual sensors. The individual sensors can form an array of radio frequency sensors, for example, an array of radio frequency resonators. A lateral object width of the objects and/or a lateral position of the objects in the transverse direction can be determined particularly accurately by means of the individual sensors. It can in particular be recognized in a particularly simple manner whether a separation in the transverse direction is necessary.

A further development of the method comprises a determination of widths, oriented along the transverse direction, of the contours of the consecutive objects from individual signals of the individual sensors. The widths of the contours of the consecutive objects can be determined as contour information. To determine the widths, the individual signals are processed further as individual signal components of the sensor signal.

In a further development of the method, the individual sensors are excited and read out offset in time. An interaction between the individual sensors arranged next to one another or crosstalk of a fed-in radio frequency signal between the individual sensors can thereby be avoided. Alternatively, only a respective one of the individual sensors can be excited, while all the individual sensors are read out so that an electromagnetic coupling of the individual sensors can be measured and used to determine the dielectric conductivity of the detection zone. A time change of the electromagnetic coupling of the individual sensors can in particular be taken into account in the measurement of the time curve of the dielectric conductivity.

In a further development of the method, a conveying speed of the conveying path and lengths of the contours of the objects are additionally determined from the conveying speed and from the time curve of the dielectric conductivity.

An absolute length of the contours of the objects can be determined by means of the conveying speed. This allows exact contour information of the consecutive objects to be determined even with a varying conveying speed. The conveying speed can be used as an input variable when determining the contour information.

In a further development of this method, the conveying speed of the objects along the conveying path is determined by means of a rotary encoder for determining a rotational speed of a transport roller arranged at the conveying path. A rotary encoder allows a particularly simple and cost-effective determination of the conveying speed of the conveying path. The rotary encoder can in particular be arranged integrated together with the radio frequency sensor in the transport roller. In addition, an evaluation device for generating the contour information that is connected to the radio frequency sensor and to the rotary encoder can also be arranged in the transport roller, for example, on the support plate of the radio frequency sensor. Overall, the rotary encoder and the radio frequency sensor can therefore be arranged together in a particularly space-saving manner.

A further development of the method comprises a determination of the distance between the object and the conveying path by means of a distance sensor arranged below the conveying path, in particular by means of an optical sensor arranged below the conveying path. Objects that are not areally disposed on the conveying path, for example since they are partly disposed on a further object, can in particular be recognized by means of the distance sensor. A distance sensor signal generated by the distance sensor can be used as an input variable when determining the contour information. Analogously to the radio frequency sensor comprising a plurality of individual sensors, the distance sensor can also comprise a plurality of individual distance sensors arranged along the transverse direction.

A sensor device for recognizing consecutive objects on a conveying path is furthermore provided, wherein the sensor device comprises a radio frequency sensor arranged at the conveying path; and an evaluation device connected to the radio frequency sensor. The sensor device has a detection zone arranged on the conveying path and the radio frequency sensor is configured to generate an electromagnetic radio frequency field radiating into the detection zone. The evaluation device is configured to measure a time curve of a dielectric conductivity in the detection zone by means of the radio frequency field of the radio frequency sensor. In addition, the evaluation device is configured to determine contour information of the consecutive objects from the time curve of the dielectric conductivity.

The sensor device is in particular configured to carry out the method in accordance with the invention for recognizing consecutive objects on the conveying path. In this respect, all the further developments and advantages explained in connection with the method in accordance with the invention also relate to the sensor device.

A conveying device is furthermore provided having a conveying path and having a sensor device arranged at the conveying path for recognizing consecutive objects on the conveying path. The sensor device can in particular be a sensor apparatus in accordance with the invention.

The invention will be explained in the following with reference to Figures. There are shown in a schematic representation in each case.

Figure 1:
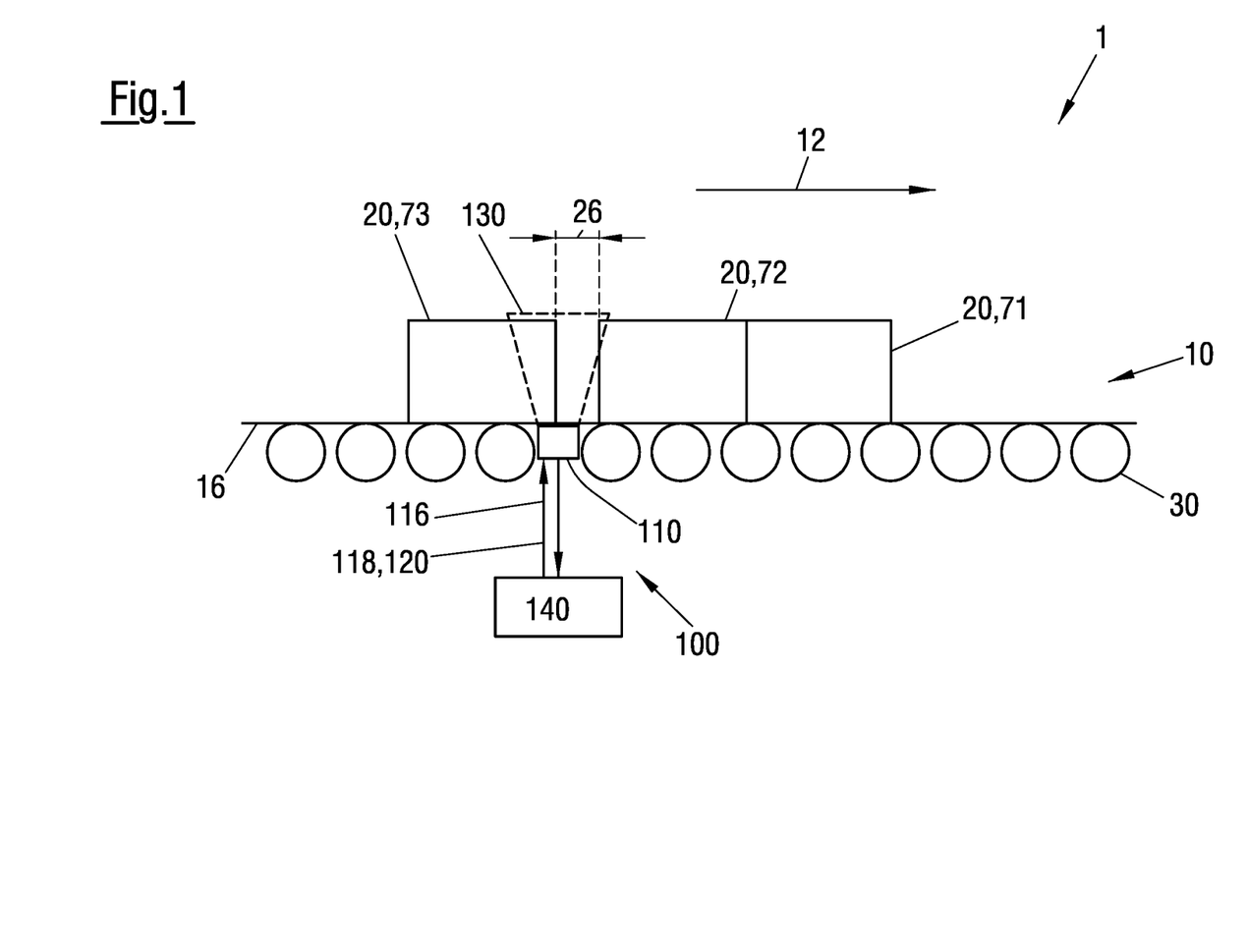
FIG. 1 a first embodiment of a conveying device with a radio frequency sensor and three consecutive objects.

FIG. 1 shows a conveying device 1 having a sensor device 100 that comprises a radio frequency sensor 110 and an evaluation device 140. The conveying device 1 comprises a conveying path 10 along which objects 20 are conveyed in a conveying direction 12. A conveyor belt 16 extends along the conveying path 10 and is disposed on transport rollers 30 arranged beneath the conveyor belt 16.

The radio frequency sensor 110 of the sensor device 100 is arranged between the transport rollers 30 beneath the conveyor belt 16 and beneath the conveying path 10. A detection zone 130, only indicated schematically, of the radio frequency sensor 110 extends through the conveyor belt 16 onto the conveying path 10. The radio frequency sensor 110 is excited by the evaluation device 140 by means of a feed signal 116, which is formed by a microwave signal, and generates a decoupling signal 118 as a sensor signal 120 that is transmitted to the evaluation device 140. The radio frequency sensor 110 is configured as a microwave resonator and the decoupling signal 118 is formed by a portion of the feed signal 116 reflected by the microwave sensor.

The evaluation device 140 is configured to measure the time curve of a dielectric conductivity in the detection zone 130 by means of the radio frequency sensor 110 and to determine contour information of the objects 20 following one another on the conveying path 10 from the time curve of the dielectric conductivity. In the representation of FIG. 1, a first object 71 is followed by a second object 72 and subsequently by a third object 73. The first object 71 and the second object 72 are disposed directly behind one another so that the distance between the first object 71 and the second object 72 amounts to zero. The second object 72 and the third object 73, in contrast, have an object distance 26 from one another that is different from zero. The evaluation device 140 is inter alia configured to determine the object distance 26 between the second object 72 and the third object 73 as well as the object distance between the first object 71 and the second object 72, which amounts to zero, as contour information.

Figure 2:
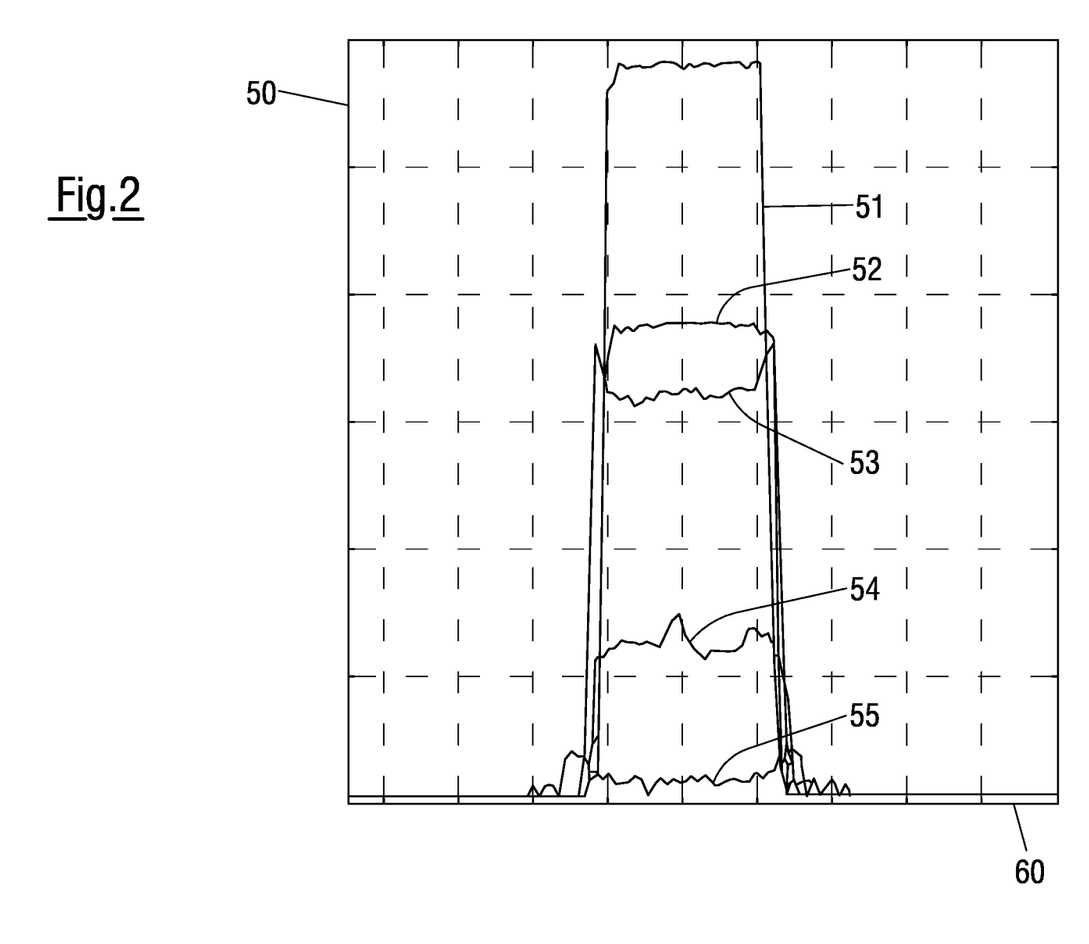
FIG. 2 a time curve of measurement variable signals of the radio frequency sensor.

To determine the contour information of the objects 20 following one another on the conveying path 10, the evaluation device 140 is configured to derive the dielectric conductivity as a measurement variable from the sensor signal 120. In FIG. 2, the progression of the dielectric conductivity 50 derived as a measurement variable is shown in dependence on the time 60 for objects 20 composed of different materials. The measurement variable progressions shown in FIG. 2 were measured at a frequency of the radio frequency field of 5.8 GHz. A first measurement variable progression 51, a second measurement variable progression 52, a third measurement variable progression 53, a fourth measurement variable progression 54, and a fifth measurement variable progression 55 are shown, wherein the dielectric conductivity 50 of the objects 20 passing through the detection zone 130 continuously decreases at the frequency of the radio frequency signal from the first measurement variable progression 51 up to the fifth measurement variable progression 55.

The first measurement variable progression 51 was measured while a transport box composed of a material for avoiding electrostatic discharge (ESD protection material) passed through the detection zone 130. The second measurement variable progression 52, the third measurement variable progression 53, and the fourth measurement variable progression 54 were measured while an object 20 composed of glass, sheet metal or wood passed through the detection zone 130. The fifth measurement variable progression 55 was finally measured while a transport box composed of a plastic material passed through the detection zone 130. The objects 20 used to generate the individual measurement variable progressions 51, 52, 53, 54, 55 each have an identical support surface on the conveying path 10.

Figure 3:
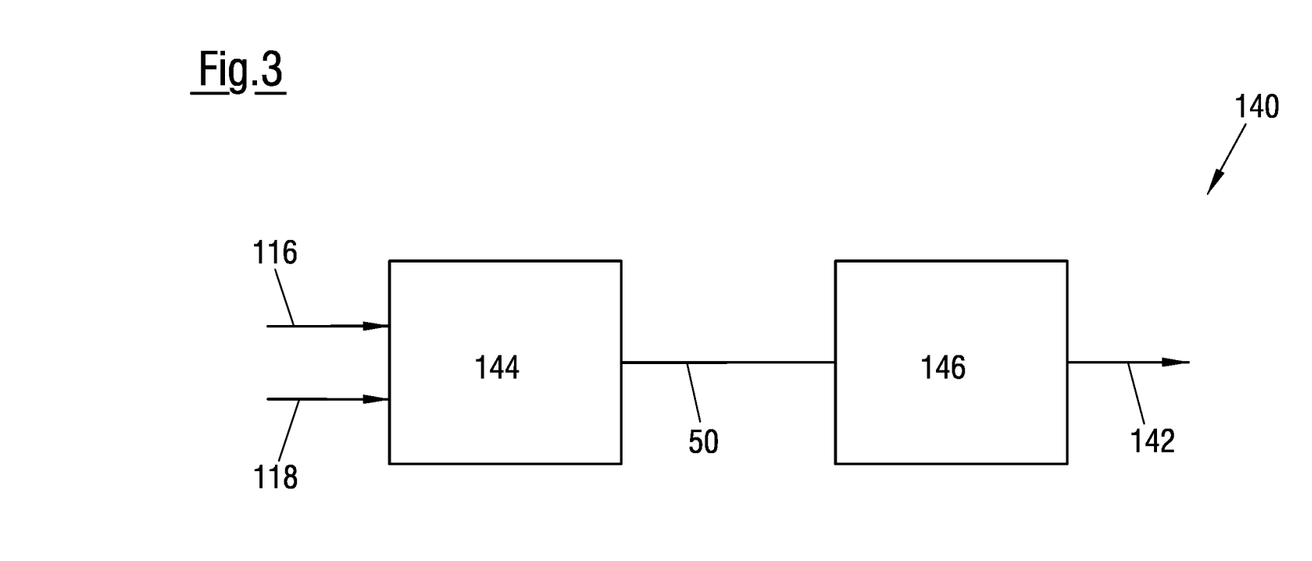
FIG. 3 an evaluation device with a preprocessing module and a contour recognition module.

FIG. 3 shows a preprocessing module 144 and a contour recognition module 146 of the evaluation device 140 connected to the preprocessing module 144. The preprocessing module 144 receives the feed signal 116 and the decoupling signal 118 transmitted by the radio frequency sensor 110. Within the framework of a data preprocessing by means of an analytical model, the preprocessing module 144 is configured to calculate the time curve of the dielectric conductivity 50 from the decoupling signal 118 and the feed signal 116 as the measurement variable transmitted to the contour recognition module 146. The contour recognition module 146 is configured to determine the contour information 142 of the objects 20 passing through the detection zone 130 from the transmitted time curve of the dielectric conductivity 50 by means of an object recognition method.

Figure 4:
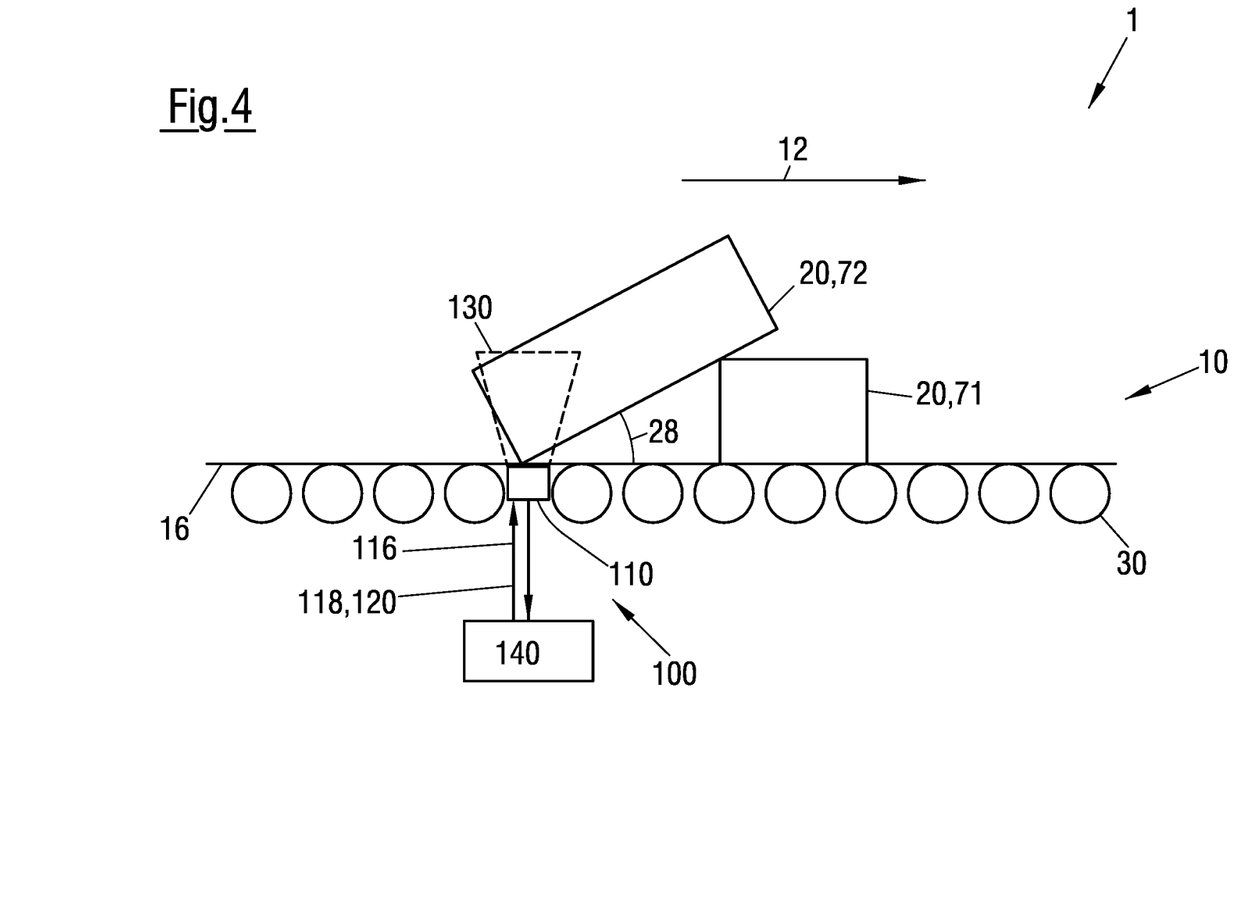
FIG. 4 the first embodiment of the conveying device with two consecutive objects.

FIG. 4 shows the conveying device 1 in the first embodiment, wherein the detection zone 130 is passed through by two objects 20. As shown, the second object 72 is in this respect partly disposed on the preceding first object 71. The second object 72 is thereby not areally disposed on the conveying path 10, but only with a rear edge. Within the framework of the determination of the contour information 142, the evaluation device 140 in particular determines an overlap of the first object 71 and the second object 72 as well as a support angle 28 between the second object 72 and the conveying path 10. The overlap of the first and second objects 71, 72 or the support angle 28 can, for example, be determined from the time curve of the dielectric conductivity 50 in that the dielectric conductivity 50 drops abruptly starting from a constant value after the passage of the first object 71 through the detection zone 130 and then rises continuously again as the filling of the detection zone 130 by the obliquely disposed second object 72 increases.

Figure 5:
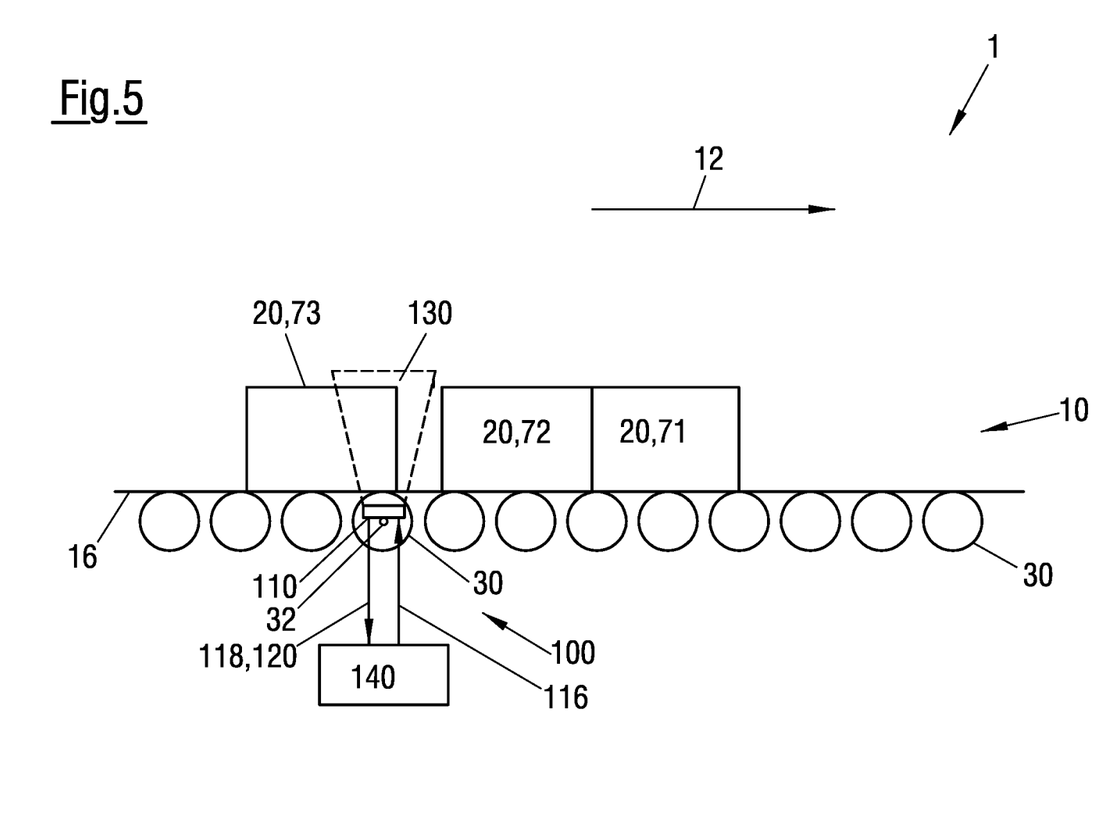
FIG. 5 a second embodiment of the conveying device with a radio frequency sensor arranged in a transport roller.

FIG. 5 shows a second embodiment of a conveying device 1 having a sensor device 100 that has a radio frequency sensor 110. In the second embodiment of the conveying device 1, the radio frequency sensor 110 is arranged in one of the transport rollers 30 of the conveying device 1. The radio frequency sensor 110 is in particular arranged on the rotary axle 32 of the transport roller 30. In an embodiment not shown here, the evaluation device 140 can also be arranged in the transport roller 30.

Figure 6:
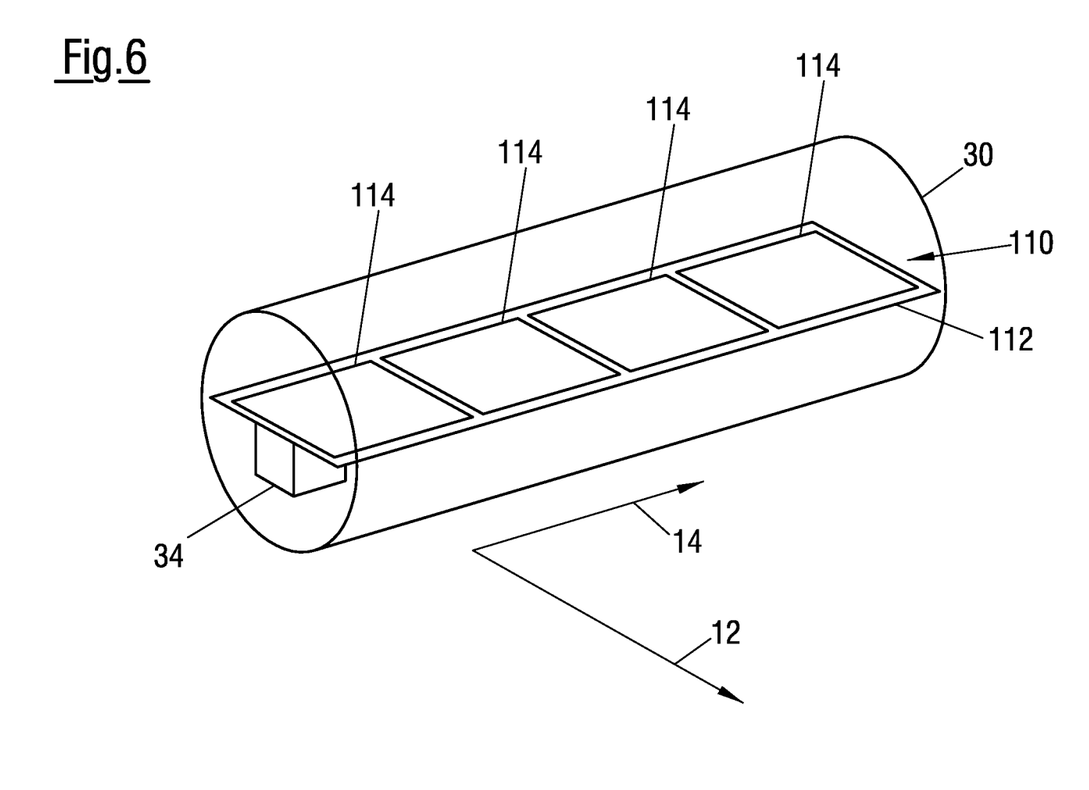
FIG. 6 the transport roller with the radio frequency sensor arranged therein.

As shown in FIG. 6, the radio frequency sensor 110 arranged in the transport roller 30 has a support plate 112 arranged on the rotary axle 32 as well as a plurality of individual sensors 114 arranged next to one another on the support plate 112 in a transverse direction 14. The sensor device 100 furthermore has a rotary encoder 34 that is likewise arranged at the rotary axle 32 of the transport roller 30 and that is at least partly formed on the support plate 112. Evaluation electronics of the rotary encoder 34 can, for example, be formed on the support plate 112. The individual sensors 114 are each configured as radio frequency resonators and are individually connected to the evaluation device 140 to excite and read out the individual sensors 114 offset in time.

Figure 7:
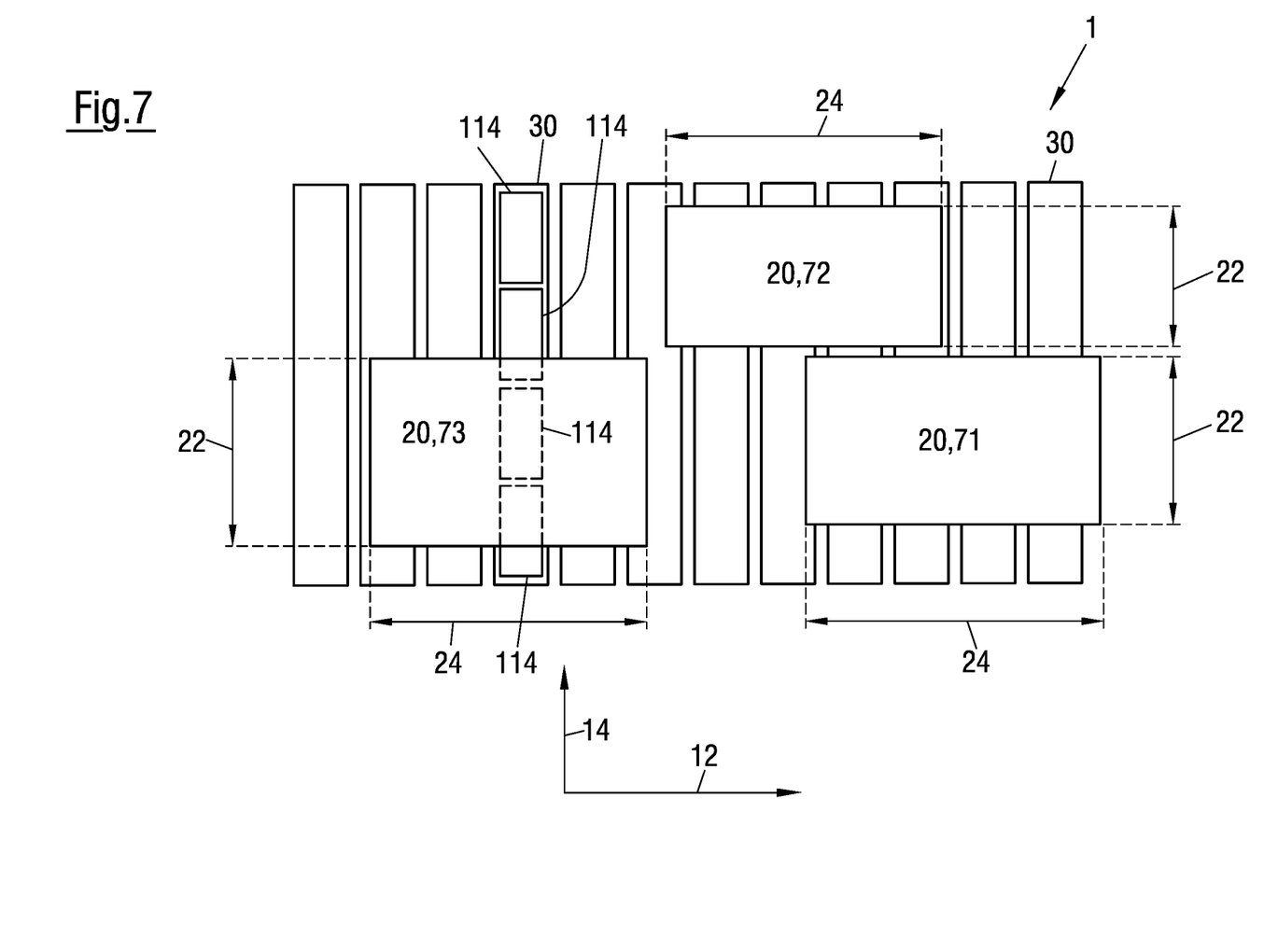
FIG. 7 a plan view of the second embodiment of the conveying device.

FIG. 7 shows a plan view of the conveying device 1 in the second embodiment with a first object 71, a second object 72, and a third object 73 that are respectively arranged after one another on the conveying path 10. In this respect, the first object 71 and the second object 72 are offset from one another and partly arranged next to one another in the transverse direction 14. The lengths 24 of the objects 71, 72, 73 along the conveying direction 12 and the widths 22 of the objects 71, 72, 73 along the transverse direction 14 are inter alia determined as contour information 142. In addition, a lateral position of the objects 71, 72, 73 in the transverse direction 14 is determined. In this respect, it can in particular be determined that the first object 71 and the second object 72 are partly arranged next to one another in the transverse direction 14.

REFERENCE NUMERAL LIST 1 conveying device
10 conveying path
12 conveying direction
14 transverse direction
16 conveyor belt
20 object
22 object width
24 object length
26 object distance
28 support angle
30 transport roller
32 rotary axle
34 rotary encoder
50 dielectric conductivity
51 first measurement variable progression
52 second measurement variable progression
53 third measurement variable progression
54 fourth measurement variable progression
55 fifth measurement variable progression
60 time axis
71 first object
72 second object
73 third object
100 sensor device
110 radio frequency sensor
112 support plate
114 individual sensors
116 feed signal
118 decoupling signal
120 sensor signal
130 detection zone
140 evaluation device
142 contour information
144 preprocessing module
146 contour recognition module

The invention claimed is:

1. A method of recognizing consecutive objects on a conveying path in a detection zone arranged on the conveying path, wherein the method comprises the following steps:
generating an electromagnetic radio frequency field radiating into the detection zone by means of a radio frequency sensor;
measuring a time curve of a dielectric conductivity in the detection zone by means of the radio frequency field of the radio frequency sensor; and
determining contour information of the consecutive objects from the time curve of the dielectric conductivity.

2. The method in accordance with claim 1, comprising:
a determination of an object distance of two consecutive objects as contour information determined from the time curve of the dielectric conductivity.

3. The method in accordance with claim 1, comprising:
a determination of an overlap of a plurality of consecutive objects as contour information determined from the time curve of the dielectric conductivity.

4. The method in accordance with claim 1, comprising
a determination of support angles of the objects passing through the detection zone as contour information determined from the time curve of the dielectric conductivity.

5. The method in accordance with claim 1, wherein the detection zone is completely arranged in a near field zone of the radio frequency field of the radio frequency sensor.

6. The method in accordance with claim 5, wherein a distance of the detection zone from the radio frequency sensor amounts to less than one wavelength of the radio frequency field.

7. The method in accordance with claim 1, wherein the radio frequency sensor is configured as a radio frequency resonator and the time curve of the dielectric conductivity is determined from a time change of a resonant frequency of the radio frequency resonator.

8. The method in accordance with claim 1, wherein the radio frequency sensor is configured as an antenna radiating into the detection zone and the time curve of the dielectric conductivity is determined from a time change of an electrical power reflected by the antenna.

9. The method in accordance with claim 1, wherein the dielectric conductivity is determined from a reflected portion of a radio frequency signal fed into the radio frequency sensor.

10. The method in accordance with claim 1, wherein the radio frequency sensor is a microwave sensor and the radio frequency field is a microwave field.

11. The method in accordance with claim 1, wherein the radio frequency sensor is arranged in a transport roller arranged at the conveying path.

12. The method in accordance with claim 11, wherein the radio frequency sensor is formed on a support plate; and wherein the support plate is arranged on a rotary axle of the transport roller.

13. The method in accordance with claim 1,
wherein the radio frequency sensor comprises a plurality of individual sensors; and
wherein the individual sensors are arranged next to one another along a transverse direction of the conveying path that is oriented perpendicular to a conveying direction of the conveying path.

14. The method in accordance with claim 13, comprising:
a determination of widths, oriented along the transverse direction, of the contours of the consecutive objects from individual signals of the individual sensors.

15. The method in accordance with claim 13, comprising:
exciting and reading out the individual sensors, with the individual sensors being excited and read out offset in time.

16. The method in accordance with claim 1, comprising:
a determination of a conveying speed of the conveying path; and
a determination of lengths of the contours of the objects from the conveying speed and from the time curve of the dielectric conductivity.

17. The method in accordance with claim 16, wherein the conveying speed of the objects along the conveying path is determined by means of a rotary encoder for determining a rotational speed of a transport roller arranged at the conveying path.

18. The method in accordance with claim 1, comprising:
a determination of a distance between the object and the conveying path by means of a distance sensor arranged below the conveying path.

19. A sensor device for recognizing consecutive objects on a conveying path,
wherein the sensor device comprises a radio frequency sensor arranged at the conveying path; and an evaluation device connected to the radio frequency sensor;
wherein the sensor device has a detection zone arranged on the conveying path;
wherein the radio frequency sensor is configured to generate an electromagnetic radio frequency field radiating into the detection zone;
wherein the evaluation device is configured to measure a time curve of a dielectric conductivity in the detection zone by means of the radio frequency field of the radio frequency sensor; and
wherein the evaluation device is configured to determine contour information of the consecutive objects from the time curve of the dielectric conductivity.

20. A conveying device having a conveying path and having a sensor device arranged at the conveying path for recognizing consecutive objects on the conveying path wherein the sensor device comprises a radio frequency sensor arranged at the conveying path; and an evaluation device connected to the radio frequency sensor;
wherein the sensor device has a detection zone arranged on the conveying path;
wherein the radio frequency sensor is configured to generate an electromagnetic radio frequency field radiating into the detection zone;
wherein the evaluation device is configured to measure a time curve of a dielectric conductivity in the detection zone by means of the radio frequency field of the radio frequency sensor; and
wherein the evaluation device is configured to determine contour information of the consecutive objects from the time curve of the dielectric conductivity.

* * * * *